United States Patent
Schroeder et al.

(10) Patent No.: US 7,754,098 B2
(45) Date of Patent: *Jul. 13, 2010

(54) CHEMICAL-MECHANICAL POLISHING COMPOSITION AND METHOD FOR USING THE SAME

(75) Inventors: David J. Schroeder, Aurora, IL (US); Kevin J. Moeggenborg, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1183 days.

This patent is subject to a terminal disclaimer.

(21) Appl. No.: 10/568,727

(22) PCT Filed: Sep. 10, 2004

(86) PCT No.: PCT/US2004/029710
§ 371 (c)(1),
(2), (4) Date: Feb. 17, 2006

(87) PCT Pub. No.: WO2005/026277
PCT Pub. Date: Mar. 24, 2005

(65) Prior Publication Data
US 2008/0057832 A1 Mar. 6, 2008

Related U.S. Application Data

(63) Continuation-in-part of application No. 10/660,379, filed on Sep. 11, 2003, now Pat. No. 7,485,241.

(51) Int. Cl.
C09K 13/00 (2006.01)
(52) U.S. Cl. .............. 252/79.1; 252/79.2; 438/691; 438/692
(58) Field of Classification Search .......... 438/690, 438/691, 692, 693; 252/79.1, 2, 79.2, 79.3
See application file for complete search history.

(56) References Cited

U.S. PATENT DOCUMENTS

| | | | |
|---|---|---|---|
| 4,064,660 A | 12/1977 | Lampert | |
| 5,769,689 A | 6/1998 | Cossaboon et al. | |
| 5,861,055 A | 1/1999 | Allman et al. | |
| 6,083,840 A | 7/2000 | Mravic et al. | |
| 6,669,748 B2 * | 12/2003 | Nishida et al. | 51/308 |
| 6,679,929 B2 | 1/2004 | Asano et al. | |
| 6,726,534 B1 | 4/2004 | Bogush et al. | |
| 7,485,241 B2 * | 2/2009 | Schroeder et al. | 252/79.1 |
| 2001/0006224 A1 * | 7/2001 | Tsuchiya et al. | 252/79 |
| 2003/0148614 A1 | 8/2003 | Simpson et al. | |

FOREIGN PATENT DOCUMENTS

| | | |
|---|---|---|
| EP | 1 193 745 | 2/2001 |
| EP | 1 229 093 | 1/2002 |
| TW | 555840 | 10/2003 |
| WO | WO02/04573 | 1/2002 |

OTHER PUBLICATIONS

Lowenstein et al., "Competitive Adsorption of Metal Ions onto Hydrophilic Silicon Surfaces from Aqueous Solution," *Journal of the Electrochemical Society*, 146(2), 719-727 (1999).
Xu et al., "Effects of Surface Ions on the Friction and Adhesion of Properties of Mica," *Langmuir*, 14(8), 2187-2190 (1998).
Pach et al, "Influence of Colloidal SiO2 particles and bacteria on crystallization of CaCO3," *Biomimetics*, 4(2), 63-82 (1996).
Michaud et al., "Experimental Simulation of Mechanisms Involved in the Building of Stresses in Concretes Subjected to Alkali-Silica Reaction," *Proceedings of the 10th International Congress on the Chemistry of Cement*, Gothenburg, Sweden (Jun. 2-6, 1997).
Okamoto et al., "Surface Modification by Calcium Ions—Effect on Chromatographic Properties of Silica," *Chromatographia*, 39(1-2), 29-34 (1994).
Meagher, "Direct Measurement of forces between silica surfaces in aqueous calcium chloride solutions using an atomic force microscope," *Journal of Colloid and Interface Science*, 152(1), 293-295 (1992).
SciFinder Search Results, Research Topic candidates identified in CAPLUS using the phrase "The effect of calcium on CMP or chemical mechanical planarization of tantalum" (Dec. 4, 2002).

* cited by examiner

*Primary Examiner*—Lan Vinh
(74) *Attorney, Agent, or Firm*—Thomas E. Omholt; Steven D. Weseman

(57) ABSTRACT

The invention provides a chemical-mechanical polishing composition comprising: (a) silica particles, (b) about $5\times10^{-3}$ to about 10 millimoles per kilogram of at least one alkaline earth metal selected from the group consisting of calcium, strontium, barium, and mixtures thereof, based on the total weight of the polishing composition, (c) about 0.1 to about 15 wt. % of an oxidizing agent, and (d) a liquid carrier comprising water. The invention also provides a polishing composition, which optionally comprises an oxidizing agent, comprising about $5\times10^{-3}$ to about 10 millimoles per kilogram of at least one alkaline earth metal selected from the group consisting of calcium, strontium, and mixtures thereof. The invention further provides methods for polishing a substrate using the aforementioned polishing compositions.

13 Claims, No Drawings

CHEMICAL-MECHANICAL POLISHING COMPOSITION AND METHOD FOR USING THE SAME

CROSS-REFERENCE TO RELATED APPLICATIONS

This application is a continuation-in-part of U.S. application for patent Ser. No. 10/660,379, filed on Sep. 11, 2003 now U.S. Pat. No. 7,485,241, which is incorporated herein by reference.

FIELD OF THE INVENTION

This invention pertains to a polishing composition and a method of polishing a substrate using the same.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. Typical multilevel interconnects comprise a first metal layer, an interlevel dielectric layer, and sometimes a third and subsequent metal layer. Interlevel dielectrics, such as doped and undoped silicon dioxide ($SiO_2$) and/or low-κ dielectrics, are used to electrically isolate the different metal layers.

The electrical connections between different interconnection levels are made through the use of metal vias. U.S. Pat. No. 5,741,626, for example, describes a method for preparing dielectric TaN layers. Moreover, U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts may be filled with various metals and alloys, such as, for example, titanium (Ti), titanium nitride (TiN), aluminum copper (Al—Cu), aluminum silicon (Al—Si), copper (Cu), tungsten (W), and combinations thereof (hereinafter referred to as "via metals").

The via metals generally employ an adhesion layer (i.e., a barrier film), such as a titanium (Ti), titanium nitride (TiN), tantalum (Ta), tantalum nitride (TaN), tungsten (W), or tungsten nitride (WN) barrier film, to adhere the via metals to the $SiO_2$ substrate. At the contact level, the barrier film acts as a diffusion barrier to prevent the via metals from reacting with $SiO_2$.

In one semiconductor manufacturing process, metal vias and/or contacts are formed by a blanket metal deposition followed by a chemical-mechanical polishing (CMP) step. In a typical process, via holes are etched through an interlevel dielectric (ILD) to interconnection lines or to a semiconductor substrate. Next, a barrier film is formed over the ILD and is directed into the etched via hole. Then, a via metal is blanket-deposited over the barrier film and into the via hole. Deposition is continued until the via hole is filled with the blanket-deposited metal. Finally, the excess metal is removed by chemical-mechanical polishing (CMP) to form metal vias. Processes for manufacturing and/or CMP of vias are disclosed in U.S. Pat. Nos. 4,671,851, 4,910,155, and 4,944,836.

Typical metal CMP systems contain an abrasive material, such as silica or alumina, suspended in an oxidizing, aqueous medium. U.S. Pat. No. 5,244,534, for example, discloses a system containing alumina, hydrogen peroxide, and either potassium or ammonium hydroxide, which is useful in removing tungsten with little removal of the underlying insulating layer. U.S. Pat. No. 5,209,816 discloses a system useful for polishing aluminum that comprises perchloric acid, hydrogen peroxide, and a solid abrasive material in an aqueous medium. U.S. Pat. No. 5,340,370 discloses a tungsten polishing system comprising potassium ferricyanide, potassium acetate, acetic acid, and silica. U.S. Pat. No. 5,391,258 and U.S. Pat. No. 5,476,606 disclose systems for polishing a composite of metal and silica which includes an aqueous medium, abrasive particles, and an anion which controls the rate of silica removal. U.S. Pat. No. 5,770,095 discloses polishing systems comprising an oxidizing agent, a chemical agent, and an etching agent selected from aminoacetic acid and amidosulfuric acid. Other polishing systems for use in CMP applications are described in U.S. Pat. Nos. 4,956,313, 5,137,544, 5,157,876, 5,354,490, and 5,527,423.

Barrier films of titanium, titanium nitride, and like metals, such as tungsten, are chemically active in general. Thus, such barrier films are similar in chemical nature to via metals. Consequently, a single system can be used effectively to polish both Ti/TiN barrier films and via metals at similar rates. Ta and TaN barrier films, however, are significantly different from Ti, TiN, and like barrier films. Ta and TaN are relatively inert in chemical nature as compared to Ti and TiN. Accordingly, the aforementioned systems are significantly less effective at polishing tantalum layers than they are at polishing titanium layers (e.g., the tantalum removal rate is significantly lower than the titanium removal rate). While via metals and barrier metals are conventionally polished with a single system due to their similarly high removal rates, joint polishing of via metals and tantalum and similar materials using conventional polishing systems results in undesirable effects, such as oxide erosion and via metal dishing.

Consequently, there remains a need for a system, composition, and/or method of polishing a substrate comprising a first metal layer and a second layer in a manner such that planarization efficiency, uniformity, and removal rate of the first metal layer are maximized and planarization of the second layer is minimized, thereby minimizing undesirable effects, such as first metal layer dishing, surface imperfections, and damage to underlying topography. The invention provides such a system, composition, and method. These and other characteristics and advantages of the invention will be apparent from the description of the invention provided herein.

BRIEF SUMMARY OF THE INVENTION

The invention provides a chemical-mechanical polishing composition comprising: (a) fumed silica particles, (b) about $5 \times 10^{-3}$ to about 10 millimoles per kilogram (mmoles/kg) of at least one alkaline earth metal selected from the group consisting of calcium, strontium, barium, and mixtures thereof, based on the total weight of the polishing composition, (c) about 0.1 to about 15 wt. % of an oxidizing agent, and (d) a liquid carrier comprising water, wherein the polishing composition has a pH of about 7 to about 13.

The invention also provides a chemical-mechanical polishing composition comprising: (a) fumed silica particles, (b) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (c) a liquid carrier comprising water, wherein the polishing composition has a pH of about 7 to about 13.

The invention provides a chemical-mechanical polishing composition comprising: (a) silica particles, including colloidal silica particles, (b) about $5\times10^{-3}$ to about 10 millimoles per kilogram (mmoles/kg) of at least one alkaline earth metal selected from the group consisting of calcium, strontium, barium, and mixtures thereof, based on the total weight of the polishing composition, (c) about 0.1 to about 15 wt. % of an oxidizing agent, and (d) a liquid carrier comprising water, wherein the polishing composition has a pH of about 7 to about 13.

The invention also provides a chemical-mechanical polishing composition comprising: (a) silica particles, including colloidal silica particles, (b) about $5\times10^{-3}$ to about 10 millimoles per kilogram (mmoles/kg) of at least one alkaline earth metal selected from the group consisting of calcium, strontium, and mixtures thereof, based on the total weight of the polishing composition, and (c) a liquid carrier comprising water, wherein the polishing composition has a pH of about 7 to about 13.

The invention further provides a method of polishing a substrate comprising the steps of: (a) providing a substrate, (b) providing a chemical-mechanical polishing composition comprising: (i) silica particles, such as fumed silica or colloidal silica, (ii) about $5\times10^{-3}$ to about 10 millimoles per kilogram (mmoles/kg) of at least one alkaline earth metal selected from the group consisting of calcium, barium, strontium, and mixtures thereof, based on the total weight of the polishing composition, (iii) about 0.1 to about 15 wt. % of an oxidizing agent, and (iv) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

The invention additionally provides a method of polishing a substrate comprising the steps of: (a) providing a substrate, (b) providing a chemical-mechanical polishing composition comprising: (i) silica particles, such as fumed silica or colloidal silica, (ii) about $5\times10^{-3}$ to about 10 millimoles per kilogram (mmoles/kg) of at least one alkaline earth metal selected from the group consisting of calcium, strontium, and mixtures thereof, based on the total weight of the polishing composition, and (iii) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

DETAILED DESCRIPTION OF THE INVENTION

The invention provides a chemical-mechanical polishing composition comprising: (a) fumed silica particles, (b) about $5\times^{-3}$ to about 10 millimoles per kilogram (mmoles/kg) of at least one alkaline earth metal selected from the group consisting of calcium, strontium, barium, and mixtures thereof, based on the total weight of the polishing composition, (c) about 0.1 to about 15 wt. % of an oxidizing agent, and (d) a liquid carrier comprising water, wherein the polishing composition has a pH of about 7 to about 13.

As noted above, the polishing composition comprises fumed silica particles. As utilized herein, the term "fumed silica particles" refers to silica particles produced by pyrogenic processes, such as the vapor phase hydrolysis of a silica precursor (e.g., $SiCl_4$). The silica particles, typically, are aggregates of smaller primary particles, which are held together by relatively strong cohesive forces. Aggregate silica particles can also form larger agglomerate particles, which are held together by relatively weak cohesive forces.

The polishing composition can comprise any suitable amount of fumed silica. Typically, the fumed silica particles are present in the polishing composition in an amount of about 0.1 wt. % or more based on the total weight of the polishing composition. The fumed silica particles typically also are present in the polishing composition in an amount of about 20 wt. % or less (e.g., about 0.1 to about 20 wt. %) based on the total weight of the polishing composition. Preferably, the fumed silica particles are present in the polishing composition in an amount of about 1 to about 10 wt. %, more preferably about 2 to about 8 wt. %, based on the total weight of the polishing composition.

The invention provides a chemical-mechanical polishing composition comprising: (a) silica particles, including colloidal silica particles, (b) about $5\times10^{-3}$ to about 10 millimoles per kilogram (mmoles/kg) of at least one alkaline earth metal selected from the group consisting of calcium, strontium, barium, and mixtures thereof, based on the total weight of the polishing composition, (c) about 0.1 to about 15 wt. % of an oxidizing agent, and (d) a liquid carrier comprising water, wherein the polishing composition has a pH of about 7 to about 13.

As noted above, the polishing composition comprises fumed silica particles. As utilized herein, the term "colloidal silica particles" refers to colloidally dispersed condensation-polymerized silica, typically prepared by condensing $Si(OH)_4$.

The polishing composition can comprise any suitable amount of colloidal silica. Typically, the colloidal silica particles are present in the polishing composition in an amount of about 0.1 wt. % or more based on the total weight of the polishing composition. The colloidal silica particles typically also are present in the polishing composition in an amount of about 20 wt. % or less (e.g., about 0.1 to about 20 wt. %) based on the total weight of the polishing composition. Preferably, the colloidal silica particles are present in the polishing composition in an amount of about 1 to about 10 wt. %, more preferably about 2 to about 8 wt. %, based on the total weight of the polishing composition.

The polishing composition can further comprise other suitable abrasives in addition to the fumed silica particles. Suitable additional abrasives include, but are not limited to, metal oxide abrasives, such as alumina (e.g., $\alpha$-alumina, $\gamma$-alumina, $\delta$-alumina, and fumed alumina), silica, (e.g., colloidally dispersed condensation-polymerized silica and precipitated silica), ceria, titania, zirconia, chromia, iron oxide, germania, magnesia, co-formed products thereof, and combinations thereof. Typically, the total amount of abrasives present in the polishing composition (including the fumed silica particles) does not exceed about 25 wt. %, preferably does not exceed about 20 wt. %, based on the total weight of the polishing composition.

As noted above, the polishing composition can comprise at least one alkaline earth metal selected from the group consisting of calcium, strontium, barium, and mixtures thereof. In another embodiment, the polishing composition can comprise at least one alkaline earth metal selected from the group consisting of calcium, strontium, and mixtures thereof. The alkaline earth metal contained in the polishing composition can be derived from any suitable source. Preferably, the alkaline earth metal contained in the polishing composition is derived from at least one water-soluble alkaline earth metal salt.

The alkaline earth metal is present in the polishing composition in an amount of about $5\times10^{-3}$ to about 10 millimoles per kilogram (mmoles/kg) based on the total weight of the polishing composition. Generally, the alkaline earth metal is present in the polishing composition in an amount of about $5\times10^{-3}$ mmoles/kg or more, preferably about $7\times10^{-3}$ mmoles/kg or more, more preferably about $8\times10^{-3}$ mmoles/kg or more, and most preferably about $1\times10^{-2}$ mmoles/kg or more, based on the total weight of the polishing composition. Preferably, the alkaline earth metal is present in the polishing composition in an amount of about $5\times10^{-3}$ to about 7.5 mmoles/kg, more preferably about $5\times10^{-3}$ to about 5 mmoles/kg, still more preferably about $5\times10^{-3}$ to about 3 mmoles/kg, and most preferably about $5\times10^{-3}$ to about 2.5 mmoles/kg, based on the total weight of the polishing composition. In certain embodiments, such as when the alkaline earth metal comprises calcium, the alkaline earth metal can be present in the polishing composition in an amount of about $5\times10^{-3}$ to about 7.5 mmoles/kg, preferably about $7.5\times10^{-3}$ to about 5 mmoles/kg, more preferably about $1\times10^{-2}$ to about 3 mmoles/kg, and most preferably about $2.5\times10^{-2}$ to about 2.5 mmoles/kg, based on the total weight of the polishing composition. When the alkaline earth metal comprises strontium, the alkaline earth metal can be present in the polishing composition in an amount of about $5\times10^{-3}$ to about 6 mmoles/kg, preferably about $5\times10^{-3}$ to about 4 mmoles/kg, more preferably about $7.5\times10^{-3}$ to about 2 mmoles/kg, and most preferably about $1\times10^{-2}$ to about 1.5 mmoles/kg, based on the total weight of the polishing composition. When the alkaline earth metal comprises barium, the alkaline earth metal can be present in the polishing composition in an amount of about $5\times10^{-3}$ to about 5 mmoles/kg, preferably about $5\times10^{-3}$ to about 2 mmoles/kg, more preferably about $6\times10^{-3}$ to about 1 mmoles/kg, and most preferably about $7\times10^{-3}$ to about 0.75 mmoles/kg, based on the total weight of the polishing composition.

In certain embodiments, the polishing composition comprises an oxidizing agent. Suitable oxidizing agents include, but are not limited to, inorganic and organic per-compounds, bromates, nitrates, chlorates, chromates, iodates, iron and copper salts (e.g., nitrates, sulfates, EDTA, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide.

The polishing composition can comprise any suitable amount of an oxidizing agent. Preferably, when present, the oxidizing agent is present in the polishing composition in an amount of about 0.1 wt. %, more preferably about 0.5 wt. % or more, and most preferably about 1 wt. % or more, based on the total weight of the polishing composition. The oxidizing agent, when present, is also preferably present in the polishing composition in an amount of about 30 wt. % or less, more preferably about 20 wt. % or less, still more preferably about 15 wt. % or less (e.g., about 0.1 to about 15 wt. %), even more preferably about 8 wt. % or less (e.g., about 0.5 to about 8 wt. %), and most preferably about 5 wt. % or less (e.g., about 1 to about 5 wt. %), based on the total weight of the polishing composition.

A liquid carrier is used to facilitate the application of the fumed or colloidal silica particles, alkaline earth metal, and any other additives to the surface of a suitable substrate to be polished or planarized. The liquid carrier can be any suitable liquid carrier. As noted above, the liquid carrier comprises water. Preferably, the water is deionized water. The liquid carrier can further comprise a suitable water-miscible solvent. However, in certain preferred embodiments the liquid carrier consists essentially of, or consists, of water, more preferably deionized water.

The polishing composition has a pH of about 7 to about 13. Preferably, the polishing composition has a pH of about 8 to about 12, more preferably about 8 to about 11. The pH of the chemical-mechanical polishing system can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be potassium hydroxide, sodium hydroxide, ammonium hydroxide, or a combination thereof. The pH buffering agent can be any suitable buffering agent, for example, phosphates, acetates, borates, ammonium salts, and the like. The chemical-mechanical polishing system can comprise any suitable amount of a pH adjustor and/or a pH buffering agent, provided such amount is sufficient to achieve and/or maintain the pH of the polishing system within the ranges set forth herein.

The polishing composition can further comprise an acid. The acid can be any suitable acid, such as an inorganic or an organic acid, or a combination thereof. For example, the polishing composition can comprise an inorganic acid selected from the group consisting of nitric acid, phosphoric acid, sulfuric acid, salts thereof, and combinations thereof. The polishing composition can comprise (alternatively or in addition to the inorganic acid) an organic acid selected from the group consisting of oxalic acid, malic acid, malonic acid, tartaric acid, acetic acid, lactic acid, propionic acid, phthalic acid, benzoic acid, citric acid, succinic acid, salts thereof, and combinations thereof. When present, the acid(s) can be present in the polishing composition in any suitable amount(s).

The polishing composition also can comprise a corrosion inhibitor (i.e., a film-forming agent). The corrosion inhibitor can be any suitable corrosion inhibitor. Typically, the corrosion inhibitor is an organic compound containing a heteroatom-containing functional group. For example, the corrosion inhibitor can be a heterocyclic organic compound with at least one 5- or 6-member heterocyclic ring as the active functional group, wherein the heterocyclic ring contains at least one nitrogen atom, for example, an azole compound. Preferably, the corrosion inhibitor contains at least one azole group. More preferably, the corrosion inhibitor is selected from the group consisting of 1,2,3-triazole, 1,2,4-triazole, benzotriazole, benzimidazole, benzothiazole, and mixtures thereof. The amount of corrosion inhibitor used in the polishing system typically is about 0.0001 wt. % to about 3 wt. % (preferably about 0.001 wt. % to about 2 wt. %) based on the total weight of the polishing composition.

The polishing composition optionally further comprises a chelating or complexing agent. The complexing agent is any suitable chemical additive that enhances the removal rate of the substrate layer being removed. Suitable, chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of chelating or complexing agent will depend on the type of substrate layer being removed.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The polishing composition can further comprise a surfactant. Suitable surfactants can include, for example, cationic surfactants, anionic surfactants, nonionic surfactants, amphoteric surfactants, mixtures thereof, and the like. Preferably, the polishing composition comprises a nonionic surfactant. One example of a suitable nonionic surfactant is an ethylenediamine polyoxyethylene surfactant. The amount of surfactant typically is about 0.0001 wt. % to about 1 wt. % (preferably about 0.001 wt. % to about 0.1 wt. % and more preferably about 0.005 wt. % to about 0.05 wt. %) based on the total weight of the polishing composition.

The polishing composition can further comprise an anti-foaming agent. The anti-foaming agent can be any suitable anti-foaming agent. Suitable antifoaming agents include, but are not limited to, silicon-based and acetylenic diol-based antifoaming agents. The amount of anti-foaming agent present in the polishing composition typically is about 10 ppm to about 140 ppm.

The polishing composition can also comprise a biocide. The biocide can be any suitable biocide, for example an isothiazolinone biocide. The amount of biocide used in the polishing composition typically is about 1 to about 50 ppm, preferably about 10 to about 20 ppm.

The polishing composition preferably is colloidally stable. The term colloid refers to the suspension of the fumed particles in the liquid carrier. Colloidal stability refers to the maintenance of that suspension through time. A polishing composition is considered colloidally stable if, when the polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the polishing composition ([C] in terms of g/ml) is less than or equal to 0.5 (i.e., $\{[B]-[T]\}/[C] \leqq 0.5$). Preferably, the value of [B]-[T]/[C] is less than or equal to 0.3, more preferably is less than or equal to 0.1, even more preferably is less than or equal to 0.05, and most preferably is less than or equal to 0.01.

The average particle size of the polishing composition preferably remains essentially unchanged throughout the useful life of the polishing composition. In particular, the average particle size of the polishing composition preferably increases by less than about 40% (e.g., less than about 35%, less than about 30%, less than about 25%, less than about 20%, less than about 15%, or less than about 10%) throughout the useful life of the polishing composition (e.g., about 90 days or more, about 180 days or more, or about 365 days or more).

In another embodiment, the invention provides a chemical-mechanical polishing composition comprising: (a) fumed silica particles, (b) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (c) a liquid carrier comprising water, wherein the polishing composition has a pH of about 7 to about 13. The other characteristics of this embodiment of the chemical-mechanical polishing composition of the invention (e.g., the amount of fumed silica particles, the amount of the alkaline earth metal, the liquid carrier, the pH, and other suitable additives) can be the same as set forth above for the first embodiment of the chemical-mechanical polishing composition of the invention.

The invention further provides methods of polishing a substrate with the polishing compositions as described herein. The method generally comprises the steps of (i) providing a substrate, (ii) providing a polishing composition as described herein, and (iii) applying the polishing composition to a portion of the substrate, and (iv) abrading a portion of the substrate to polish the substrate.

In another embodiment, the invention provides a chemical-mechanical polishing composition comprising: (a) colloidal silica particles, (b) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (c) a liquid carrier comprising water, wherein the polishing composition has a pH of about 7 to about 13. The other characteristics of this embodiment of the chemical-mechanical polishing composition of the invention (e.g., the amount of silica particles, the amount of the alkaline earth metal, the liquid carrier, the pH, and other suitable additives) can be the same as set forth above for the first embodiment of the chemical-mechanical polishing composition of the invention.

The invention further provides methods of polishing a substrate with the polishing compositions as described herein. The method generally comprises the steps of (i) providing a substrate, (ii) providing a polishing composition as described herein, and (iii) applying the polishing composition to a portion of the substrate, and (iv) abrading a portion of the substrate to polish the substrate.

In one embodiment, the method of polishing a substrate comprises the steps of: (a) providing a substrate, (b) providing a chemical-mechanical polishing composition comprising: (i) fumed silica particles, (ii) about $5 \times 10^{-3}$ to about 10 millimoles per kilogram (mmoles/kg) of at least one alkaline earth metal selected from the group consisting of calcium, barium, strontium, and mixtures thereof, based on the total weight of the polishing composition, (iii) about 0.1 to about 15 wt. % of an oxidizing agent, and (iv) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

The polishing composition utilized in this method embodiment of the invention comprises (i) fumed silica particles, (ii) about $5 \times 10^{-3}$ to about 10 millimoles per kilogram (mmoles/kg) of at least one alkaline earth metal selected from the group consisting of calcium, barium, strontium, and mixtures thereof, based on the total weight of the polishing composition, (iii) about 0.1 to about 15 wt. % of an oxidizing agent, and (iv) a liquid carrier, and has a pH of about 7 to about 13. The other characteristics of the chemical-mechanical polishing composition utilized in this method embodiment of the invention (e.g., the amount of fumed silica particles, the amount of the alkaline earth metal, the amount of oxidizing agent, the liquid carrier, the pH, and other suitable additives) can be the same as set forth above for the chemical-mechanical polishing composition of the invention.

In one embodiment, the method of polishing a substrate comprises the steps of: (a) providing a substrate, (b) providing a chemical-mechanical polishing composition comprising: (i) colloidal silica particles, (ii) about $5 \times 10^{-3}$ to about 10 millimoles per kilogram (mmoles/kg) of at least one alkaline earth metal selected from the group consisting of calcium, barium, strontium, and mixtures thereof, based on the total weight of the polishing composition, (iii) about 0.1 to about 15 wt. % of an oxidizing agent, and (iv) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

The polishing composition utilized in this method embodiment of the invention comprises (i) colloidal silica particles, (ii) about $5 \times 10^{-3}$ to about 10 millimoles per kilogram (mmoles/kg) of at least one alkaline earth metal selected from the group consisting of calcium, barium, strontium, and mixtures thereof, based on the total weight of the polishing composition, (iii) about 0.1 to about 15 wt. % of an oxidizing agent, and (iv) a liquid carrier, and has a pH of about 7 to about 13. The other characteristics of the chemical-mechanical polishing composition utilized in this method embodiment of the invention (e.g., the amount of silica particles, the amount of the alkaline earth metal, the amount of oxidizing agent, the liquid carrier, the pH, and other suitable additives) can be the same as set forth above for the chemical-mechanical polishing composition of the invention.

In another embodiment, the method of polishing a substrate comprises the steps of: (a) providing a substrate, (b) providing a chemical-mechanical polishing composition comprising: (i) fumed silica particles, (ii) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (iii) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

The polishing composition utilized in this other method embodiment of the invention comprises (i) fumed silica particles, (ii) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (iii) a liquid carrier, and has a pH of about 7 to about 13. The other characteristics of the chemical-mechanical pol-ishing composition utilized in this method embodiment of the invention (e.g., the amount of fumed silica particles, the amount of the alkaline earth metal, the liquid carrier, the pH, and other suitable additives) can be the same as set forth above for the chemical-mechanical polishing composition of the invention.

In another embodiment, the method of polishing a substrate comprises the steps of: (a) providing a substrate, (b) providing a chemical-mechanical polishing composition comprising: (i) colloidal silica particles, (ii) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (iii) a liquid carrier comprising water, wherein the polishing composition has a pH of about 7 to about 13, (c) applying the chemical-mechanical polishing composition to at least a portion of the substrate, and (d) abrading at least a portion of the substrate with the polishing composition to polish the substrate.

The polishing composition utilized in this other method embodiment of the invention comprises (i) colloidal silica particles, (ii) about $5 \times 10^{-3}$ to about 10 millimoles per kilogram (mmoles/kg) of at least one alkaline earth metal selected from the group consisting of calcium, strontium, and mixtures thereof, based on the total weight of the polishing composition, and (iii) a liquid carrier, and has a pH of about 7 to about 13. The other characteristics of the chemical-mechanical polishing composition utilized in this method embodiment of the invention (e.g., the amount of colloidal silica particles, the amount of the alkaline earth metal, the liquid carrier, the pH, and other suitable additives) can be the same as set forth above for the chemical-mechanical polishing composition of the invention.

The substrate to be polished using the methods of the invention can be any suitable substrate. Suitable substrates include, but are not limited to, integrated circuits, memory or rigid disks, metals, interlayer dielectric (ILD) devices, semiconductors, micro-electro-mechanical systems, ferroelectrics, and magnetic heads. The metal layer can comprise any suitable metal. For example, the metal layer can comprise copper, tantalum (e.g., tantalum nitride), titanium, aluminum, nickel, platinum, ruthenium, iridium, or rhodium. The substrate can further comprise at least one insulating layer. The insulating layer can be a metal oxide, porous metal oxide, glass, organic polymer, fluorinated organic polymer, or any other suitable high or low-κ insulating layer. Preferably, the substrate comprises tantalum or tantalum nitride, and at least a portion of the tantalum or tantalum nitride is abraded with the polishing composition to polish the substrate.

The polishing methods of the invention are particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the substrate are known in the art.

Desirably, the inspection or monitoring of the progress of the polishing process with respect to a substrate being polished enables the determination of the polishing end-point, i.e., the determination of when to terminate the polishing process with respect to a particular substrate.

The CMP apparatus can further comprise a means for oxidizing the substrate. In electrochemical polishing systems, the means for oxidizing the substrate preferably comprises a device for applying a time-varying potential (e.g., anodic potential) to the substrate (e.g., electronic potentiostat). The device for applying time-varying potential to the substrate can be any suitable such device. The means for oxidizing the substrate preferably comprises a device for applying a first potential (e.g., a more oxidizing potential) during an initial stage of the polishing and applying a second potential (e.g., a less oxidizing potential) at or during a later stage of polishing, or a device for changing the first potential to the second potential during an intermediate stage of polishing, e.g., continuously reducing the potential during the intermediate stage or rapidly reducing the potential from a first, higher oxidizing potential to a second, lower oxidizing potential after a predetermined interval at the first, higher oxidizing potential. For example, during the initial stage(s) of the polishing, a relatively high oxidizing potential is applied to the substrate to promote a relatively high rate of oxidation/dissolution/removal of the substrate. When polishing is at a later stage, e.g., when approaching an underlying barrier layer, the applied potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379,223 further describes a means for oxidizing a substrate by applying a potential.

The following examples further illustrate the invention but, of course, should not be construed as in any way limiting its scope.

Example 1

This example demonstrates the enhanced polishing rate exhibited by the polishing composition of the invention. Similar substrates comprising tantalum were polished using seven different polishing compositions (Polishing Compositions 1A, 1B, 1C, 1D, 1E, 1F, and 1G). Polishing Composition 1A (invention) comprised about 0.50 millimoles per kilogram (mmoles/kg) (approximately 20 ppm) of calcium (as calcium chloride) based on the total weight of the polishing composition. Polishing Composition 1B (comparative) did not contain an appreciable amount of metal ions. Polishing Composition 1C (comparative) comprised about 7.41 mmoles/kg (approximately 200 ppm) of aluminum (as aluminum sulfate octadecahydrate). Polishing Composition 1D (comparative) comprised about 0.82 mmoles/kg (approximately 20 ppm) of magnesium (as magnesium acetate hydrate). Polishing Composition 1E (comparative) comprised about 1.04 mmoles/kg (approximately 50 ppm) of titanium (as titanium trichloride). Polishing Composition 1F (comparative) comprised about 0.33 mmoles/kg (approximately 30 ppm) of zirconium (as zirconium sulfate hydrate). Polishing Composition 1G (comparative) comprised about 0.54 mmoles/kg (approximately 30 ppm) of iron (as iron sulfate). Each of the aforementioned polishing compositions also comprised about 6 wt. % fumed silica, about 3 wt. % hydrogen peroxide, about 0.3 wt. % of acetic acid, and about 0.2 wt. % benzotriazole, and had a pH of about 10 before the addition of the oxidizing agent. The values for the tantalum removal rate (in angstroms per minute) were measured for each of the polishing compositions. The results are summarized in Table 1.

TABLE 1

Tantalum removal rates.

| Polishing Composition | Metal | Concentration (mmoles/kg) | Tantalum Removal Rate (Å/min) |
|---|---|---|---|
| 1A (invention) | Ca | 0.50 | 608 |
| 1B (comparative) | — | — | 90 |
| 1C (comparative) | Al | 7.41 | 103 |
| 1D (comparative) | Mg | 0.82 | 113 |
| 1E (comparative) | Ti | 1.04 | 88 |
| 1F (comparative) | Zr | 0.33 | 80 |
| 1G (comparative) | Fe | 0.54 | 82 |

These results demonstrate that the polishing composition of the invention exhibits a high tantalum removal rate as compared to similar polishing compositions comprising no appreciable amount of metal ions or ions of a metal other than calcium, strontium, or barium. In particular, Polishing Composition 1A (invention), which comprised about 0.50 mmoles/kg of calcium, exhibited a tantalum removal rate that was nearly 500% higher than the tantalum removal rates for Polishing Compositions 1B-1G (comparative), which did not contain an appreciable amount of calcium, strontium, or barium ions.

Example 2

This example demonstrates the enhanced polishing rate exhibited by the polishing composition of the invention. Similar substrates comprising tantalum were polished using six different polishing compositions (Polishing Compositions 2A, 2B, 2C, 2D, 2E, and 2F). Polishing Composition 2A (comparative) did not contain an appreciable amount of calcium, strontium, or barium ions. Polishing Compositions 2B-2E (invention) respectively contained 0.125, 0.249, 0.499, 1.247, and 2.494 millimoles per kilogram (mmoles/kg) of calcium (as calcium chloride), based on the total weight of the polishing composition. Each of the aforementioned polishing compositions also comprised about 6 wt. % fumed silica, about 3 wt. % hydrogen peroxide, about 0.3 wt. % of acetic acid, and about 0.2 wt. % benzotriazole, and had a pH of about 10 before the addition of the oxidizing agent. The values for the tantalum removal rate (in angstroms per minute) were measured for each of the polishing compositions, as well as the within-wafer-non-uniformity (WIWNU) of each of the substrates after polishing. The results are summarized in Table 2.

TABLE 2

Tantalum removal rates and within-wafer-non-uniformity measurements.

| Polishing Composition | Calcium concentration (mmoles/kg) | Tantalum Removal Rate (Å/min) | WIWNU |
|---|---|---|---|
| 2A (comparative) | — | 103 | 28 |
| 2B (invention) | 0.125 | 354 | 26 |
| 2C (invention) | 0.249 | 517 | 22 |
| 2D (invention) | 0.499 | 590 | 21 |
| 2E (invention) | 1.247 | 663 | 16 |
| 2F (invention) | 2.494 | 715 | 21 |

These results demonstrate that the polishing composition of the invention exhibits a high tantalum removal rate as compared to a similar polishing composition that does not contain an appreciable amount of calcium, strontium, or barium ions. For example, a comparison of Polishing Compositions 2A and 2B reveals that a calcium concentration of only 0.125 mmoles/kg results in an over 200% increase in the tantalum removal rate as compared to a similar polishing composition that does not contain an appreciable amount of calcium ions. These results also demonstrate that the polishing composition of the invention is capable of achieving a relatively high tantalum removal rate without increasing the within-wafer-non-uniformity of the polished substrate. Indeed, Polishing Compositions 2B-2F (invention) each demonstrated a decrease in the measured within-wafer-non-uniformity as compared to Polishing Composition 2A (comparative), which did not comprise an appreciable amount of calcium, strontium, or barium ions.

Example 3

This example demonstrates the enhanced polishing rate exhibited by the polishing composition of the invention. Similar substrates comprising tantalum were polished using three different polishing compositions (Polishing Compositions 3A, 3B, and 3C). Polishing Compositions 3A and 3B (comparative) did not contain an appreciable amount of calcium, strontium, or barium ions. Polishing Composition 3C (invention) contained 1.0 millimoles per kilogram (mmoles/kg) of calcium (as calcium chloride), based on the total weight of the polishing composition. Polishing Compositions 3B and 3C further contained about 0.3 wt. % acetic acid. Each of the aforementioned polishing compositions also comprised about 6 wt. % fumed silica, about 3 wt. % hydrogen peroxide, and about 0.2 wt. % benzotriazole, and had a pH of about 10 before the addition of the oxidizing agent. The values for the tantalum removal rate (in angstroms per minute) were measured for each of the polishing compositions, as well as the within-wafer-non-uniformity uniformity (WIWNU) of each of the substrates after polishing. The results are summarized in Table 3.

TABLE 3

Tantalum removal rates and within-wafer-non-uniformity measurements.

| Polishing Composition | Acetic Acid Concentration (wt. %) | Calcium concentration (mmoles/kg) | Tantalum Removal Rate (Å/min) | WIWNU |
| --- | --- | --- | --- | --- |
| 3A (comparative) | — | — | 52 | 20.4 |
| 3B (comparative) | 0.3 | — | 114 | 16.1 |
| 3C (invention) | 0.3 | 1.0 | 900 | 13.7 |

These results demonstrate that the polishing composition of the invention exhibits a high tantalum removal rate as compared to a similar polishing composition that does not contain an appreciable amount of calcium, strontium, or barium ions. For example, a comparison of the tantalum removal rates for Polishing Compositions 3A and 3C reveals that a calcium concentration of about 1.0 mmoles/kg results in an over 1600% increase relative to a similar polishing composition that does not comprise an appreciable amount of calcium, strontium, or barium ions. Furthermore, a comparison of the tantalum removal rates for Polishing Compositions 3B and 3C reveals that the marked increase in the tantalum removal rate exhibited by the polishing composition of the invention over a polishing composition that does not comprise an appreciable amount of calcium, strontium, or barium ions is due, in major part, to the presence of the calcium, barium, or strontium ions. Lastly, the data set forth in Table 3 demonstrates that a substrate polished with the polishing composition of the invention does not exhibit an increase in the measurable within-wafer-non-uniformity value relative to a substrate polished with a similar polishing composition that does not comprise an appreciable amount of calcium, strontium, or barium ions.

Example 4

This example demonstrates the enhanced polishing rate exhibited by the polishing composition of the invention. Similar substrates comprising tantalum were polished using six different polishing compositions (Polishing Compositions 4A, 4B, 4C, 4D, 4F, and 4G). Polishing Composition 4A (comparative) did not contain an appreciable amount of calcium, strontium, or barium ions. Polishing Compositions 4B, 4C, and 4D (invention) each contained 1.0 millimoles per kilogram (mmoles/kg) of calcium (as calcium chloride), based on the total weight of the polishing composition. Polishing Composition 4E (invention) contained 0.46 mmoles/kg of strontium (as strontium chloride), based on the total weight of the polishing composition. Polishing Composition 4F (invention) contained 0.29 mmoles/kg of barium (as barium hydroxide), based on the total weight of the polishing composition. Polishing Compositions 4A and 4B each contained about 6 wt. % of a commercially available fumed silica (Aerosil® 90 fumed silica, Degussa AG), and Polishing Compositions 4C-4F each contained about 6 wt. % of a different commercially available fumed silica (Cab-O-Sil® L-90 fumed silica, Cabot Corporation). Polishing Composition 4D further contained a nonionic surfactant (Igepal® CO-890, BASF Corporation). Each of the aforementioned polishing compositions also comprised about 3 wt. % hydrogen peroxide, about 0.3 wt. % of acetic acid, and about 0.1 wt. % benzotriazole. Each of the polishing compositions had a pH of about 10 before the addition of the oxidizing agent, except for Polishing Composition 4C, which had a pH of about 9. The values for the tantalum removal rate (in angstroms per minute) were measured for each of the polishing compositions, as well as the within-wafer-non-uniformity (WIWNU) of each of the substrates after polishing. The results are summarized in Table 4.

TABLE 4

Tantalum removal rates and within-wafer-non-uniformity measurements.

| Polishing Composition | Metal | Metal concentration (mmoles/kg) | Tantalum Removal Rate (Å/min) | WIWNU |
| --- | --- | --- | --- | --- |
| 4A (comparative) | — | — | 117 | 13.3 |
| 4B (invention) | Ca | 1.0 | 828 | 9.5 |
| 4C (invention) | Ca | 1.0 | 853 | 18.0 |
| 4D (invention) | Ca | 1.0 | 809 | 17.5 |
| 4E (invention) | Sr | 0.46 | 809 | 26.9 |
| 4F (invention) | Ba | 0.29 | 753 | 26.4 |

These results demonstrate that the polishing composition of the invention exhibits a high tantalum removal rate as compared to a similar polishing composition that does not contain an appreciable amount of calcium, strontium, or barium ions. For example, a comparison of Polishing Compositions 4A and 4B reveals that a calcium concentration of about 1.0 mmoles/kg results in an over 600% increase in the tantalum removal rate as compared to a similar polishing composition that does not contain an appreciable amount of calcium, strontium, or barium ions. The comparison further reveals that the polishing composition of the invention is capable of achieving a relatively high tantalum removal rate without increasing the within-wafer-non-uniformity of the polished substrate. Indeed, Polishing Compositions 4B (invention) demonstrated a decrease in the within-wafer-non-uniformity as compared to Polishing Composition 4A (comparative). A further comparison of Polishing Compositions 4A, 4E, and 4F reveals that a polishing composition comprising 0.46 mmoles/kg of strontium or 0.29 mmoles/kg of barium exhibits an over 500% increase in tantalum removal rate as compared to a similar polishing composition that does not comprise an appreciable amount of calcium, strontium, or barium ions.

Example 5

This example demonstrates the enhanced polishing rate exhibited by the polishing composition of the invention in slurries with colloidal silica abrasives. Similar substrates comprising tantalum were polished using 18 different polishing compositions (Polishing Compositions 1A-1T). Polishing Compositions 1A, 1C, 1E, 1G, 1J, 1L, 1N, 1Q, and 1S (invention) comprised about 0.50 millimoles per kilogram (mmoles/kg) (approximately 20 ppm) of added calcium (as calcium chloride) based on the total weight of the polishing composition. Polishing Compositions 1B, 1D, 1F, 1H, 1K, 1M, 1P, 1R, and 1T (comparative) did not contain added calcium ion. Each of the aforementioned polishing compositions also comprised about 6 wt. % colloidal silica, about 3 wt. % hydrogen peroxide, and about 0.3 wt. % of acetic acid, and had a pH of about 10 before the addition of the oxidizing agent. The silica particles present in compositions 1A and 1B had a mean particle size of approximately 2.6 nm. The silica particles present in compositions 1C and 1D had a mean particle size of approximately 4 nm. The silica particles present in compositions 1E and 1F had a mean particle size of approximately 8.8 nm. The silica particles present in compositions 1G and 1H had a mean particle size of approximately 15 nm. The silica particles present in compositions 1J and 1K had a mean particle size of approximately 21 nm. The silica particles present in compositions 1L and 1M had a mean particle size of approximately 25 nm. The silica particles present in compositions 1N and 1P had a mean particle size of approximately 50 nm. The silica particles present in compositions 1Q and 1R had a mean particle size of approximately 80 nm. The silica particles present in compositions 1S and 1T had a mean particle size of approximately 113 nm. The values for the tantalum removal rate (in angstroms per minute) were measured for each of the polishing compositions. The results are summarized in Table 5.

TABLE 5

Tantalum removal rates.

| Composition | Particle Size (nm) | Calcium concentration (mmole/kg) | Tantalum Removal Rate (Å/min) | Enhancement Ratio |
|---|---|---|---|---|
| 1A | 2.6 | — | 88 | |
| 1B | 2.6 | 0.5 | 425 | 4.81 |
| 1C | 4 | — | 233 | |
| 1D | 4 | 0.5 | 702 | 3.01 |
| 1E | 8.8 | — | 310 | |
| 1F | 8.8 | 0.5 | 568 | 1.83 |
| 1G | 15 | — | 283 | |
| 1H | 15 | 0.5 | 527 | 1.87 |
| 1J | 21 | — | 328 | |
| 1K | 21 | 0.5 | 503 | 1.53 |
| 1L | 25 | — | 315 | |
| 1M | 25 | 0.5 | 493 | 1.57 |
| 1N | 50 | — | 289 | |
| 1P | 50 | 0.5 | 400 | 1.39 |
| 1Q | 80 | — | 272 | |
| 1R | 80 | 0.5 | 317 | 1.17 |
| 1S | 113 | — | 242 | |
| 1T | 113 | 0.5 | 250 | 1.03 |

These results demonstrate that the polishing composition of the invention exhibits a high tantalum removal rate as compared to similar polishing compositions comprising no added calcium ions. In particular, the enhancement ratio of table 5 is the ratio of tantalum removal rate for a slurry containing a given colloidal silica abrasive and 0.50 mmole/kg of calcium ion, to the tantalum removal rate of the same slurry composition without the added calcium ion. As shown in the table, the amount of rate enhancement afforded by the invention can be as high as 4.8 for slurry with a 2.6 nm average silica particle size. The efficacy of the invention is enhanced by decreased silica particle size.

Example 6

This example demonstrates the enhanced polishing rate exhibited by the polishing composition of the invention in slurries with colloidal silica abrasives. Similar substrates comprising tantalum were polished using six different polishing compositions (Polishing Compositions 2A, 2B, 2C, 2D, 2E, and 2F). Polishing Composition 2A (comparative) did not contain an appreciable amount of calcium, strontium, or barium ions. Polishing Compositions 2B-2E (invention) respectively contained 0.125, 0.25, 0.50, 0.75, and 1.25 millimoles per kilogram (mmoles/kg) of calcium (as calcium chloride), based on the total weight of the polishing composition. Each of the aforementioned polishing compositions also comprised about 6 wt. % colloidal silica, about 3 wt. % hydrogen peroxide, and about 0.3 wt. % of acetic acid, and had a pH of about 10 before the addition of the oxidizing agent. The values for the tantalum removal rate (in angstroms per minute) were measured for each of the polishing compositions. The results are summarized in Table 6.

TABLE 6

Tantalum removal rates.

| Polishing Composition | Calcium Concentration (mmoles/kg) | Tantalum Removal Rate (Å/min) |
|---|---|---|
| 2A | — | 184 |
| 2B | 0.125 | 369 |
| 2C | 0.25 | 454 |
| 2D | 0.5 | 598 |
| 2E | 0.75 | 623 |
| 2F | 1.25 | 670 |

This example demonstrates that the polishing composition of the invention exhibits a high tantalum removal rate as compared to a similar polishing composition that does not contain added calcium ions. Compositions 2A and 2B, for example, reveal that a calcium ion concentration of only 0.125 mmoles/kg results in a 100% increase in tantalum removal rate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
    (a) silica particles,
    (b) about $5\times10^{-3}$ to about 10 mmoles/kg of at least one alkaline earth metal selected from the group consisting of calcium, strontium, and mixtures thereof, based on the total weight of the polishing composition, and
    (c) a liquid carrier comprising water,
    wherein the polishing composition has a pH of about 7 to about 13.

2. The polishing composition of claim 1, wherein the polishing composition further comprises a corrosion inhibitor selected from the group consisting of 1,2,3-triazole, 1,2,4-triazole, benzothiazole, benzimidazole, benzothiazole, and mixtures thereof.

3. The polishing composition of claim 1, wherein the polishing composition further comprises a complexing or chelating agent.

4. The polishing composition of claim 1, wherein the polishing composition further comprises an acid, and the acid is an organic acid selected from the group consisting of oxalic acid, malic acid, malonic acid, tartaric acid, acetic acid, lactic acid, propionic acid, phthalic acid, benzoic acid, citric acid, succinic acid, salts thereof, and combinations thereof.

5. The polishing composition of claim 1, wherein the polishing composition further comprises an oxidizing agent.

6. The polishing composition of claim 5, wherein the oxidizing agent is present in the polishing composition in an amount of about 0.5 to about 8 wt. % based on the total weight of the polishing composition.

7. A method of polishing a substrate comprising the steps of:
    (a) providing a substrate,
    (b) providing a chemical-mechanical polishing composition comprising:
        (i) silica particles,
        (ii) about $5\times10^{-3}$ to about 10 mmoles/kg of at least one alkaline earth metal selected from the group consisting of calcium, strontium, and mixtures thereof, based on the total weight of the polishing composition, and
        (iii) a liquid carrier comprising water,
        wherein the polishing composition has a pH of about 7 to about 13,
    (c) applying the chemical-mechanical polishing composition to at least a portion of the substrate, and
    (d) abrading at least a portion of the substrate with the polishing composition to polish the substrate.

8. The method of claim 7, wherein the substrate comprises tantalum or tantalum nitride, and at least a portion of the tantalum or tantalum nitride is abraded with the polishing composition to polish the substrate.

9. The method of claim 7, wherein the polishing composition further comprises a corrosion inhibitor selected from the group consisting of 1,2,3-triazole, 1,2,4-triazole, benzotriazole, benzimidazole, benzothiazole, and mixtures thereof.

10. The method of claim 7, wherein the polishing composition further comprises a complexing or chelating agent.

11. The method of claim 7, wherein the polishing composition further comprises an acid, and the acid is an organic acid selected from the group consisting of oxalic acid, malic acid, malonic acid, tartaric acid, acetic acid, lactic acid, propionic acid, phthalic acid, benzoic acid, citric acid, succinic acid, salts thereof, and combinations thereof.

12. The method of claim 7, wherein the polishing composition further comprises an oxidizing agent.

13. The method of claim 12, wherein the oxidizing agent is present in the polishing composition in an amount of about 0.5 to about 8 wt. % based on the total weight of the polishing composition.

* * * * *